US006716715B2

United States Patent
Ciavatti (10) Patent No.: US 6,716,715 B2
(45) Date of Patent: Apr. 6, 2004

(54) DRAM BIT LINES

(75) Inventor: Jérôme Ciavatti, Saint Martin d'Heres (FR)

(73) Assignee: STMicroelectronics S.A., Montrouge (FR)

( * ) Notice: Subject to any disclaimer, the term of this patent is extended or adjusted under 35 U.S.C. 154(b) by 64 days.

(21) Appl. No.: 10/044,307

(22) Filed: Oct. 26, 2001

(65) Prior Publication Data

US 2002/0126548 A1 Sep. 12, 2002

(30) Foreign Application Priority Data

Oct. 27, 2000  (FR) .............................................. 00 13854

(51) Int. Cl.7 ............................................... H01L 21/20
(52) U.S. Cl. ....................... 438/381; 438/692; 438/954
(58) Field of Search .............................. 438/381, 241, 438/242, 270, 680, 692, 954

(56) References Cited

U.S. PATENT DOCUMENTS

| | | | | |
|---|---|---|---|---|
| 4,953,126 A | * | 8/1990 | Ema | 365/182 |
| 5,693,970 A | * | 12/1997 | Ikemasu | 257/306 |
| 5,789,289 A | | 8/1998 | Jeng | 438/253 |
| 5,893,734 A | * | 4/1999 | Jeng et al. | 438/239 |
| 5,977,583 A | | 11/1999 | Hosotani et al. | 257/311 |
| 6,083,790 A | * | 7/2000 | Lin et al. | 438/256 |

FOREIGN PATENT DOCUMENTS

| | | |
|---|---|---|
| DE | 198 60 769 | 7/1999 |
| JP | 82-64731 | 10/1996 |
| JP | 90-92794 | 4/1997 |
| JP | 10-178160 | 6/1998 |

* cited by examiner

*Primary Examiner*—David Nhu
(74) *Attorney, Agent, or Firm*—Lisa K. Jorgenson; Harold H. Bennett, II; Seed IP Law Group PLLC (57) ABSTRACT

A method for manufacturing a DRAM cell including two active word lines having a drain region and distinct source regions, including, after the forming of insulated conductive lines, the steps of: depositing a first, then a second selectively etchable insulating layers; etching the second insulating layer to only maintain it above conductive lines; depositing and leveling a third insulating layer selectively etchable with respect to at least the second insulating layer; opening the first and third insulating layers to expose the drain region and an insulating trench; filling the previously-formed opening with a conductive material; polishing the entire structure; and depositing a fourth insulating layer, selectively etchable with respect to the third insulating layer.

20 Claims, 5 Drawing Sheets

DRAM BIT LINES

BACKGROUND OF THE INVENTION

1. Field of the Invention

The present invention generally relates to the manufacturing of DRAM devices. More specifically, the present invention relates to the forming of bit line structures in such memories.

2. Description of the Related Art

Figure 1:
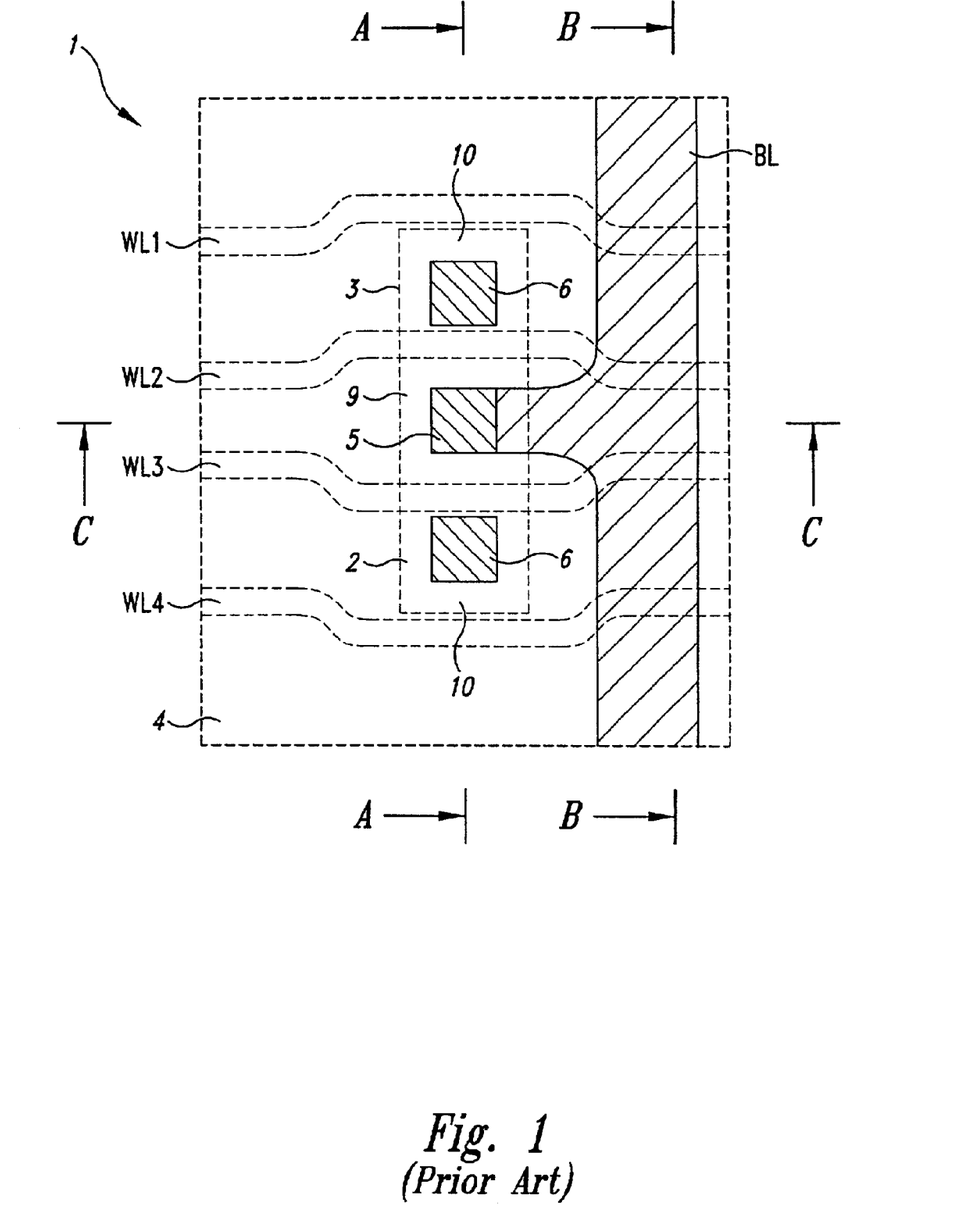
FIG. 1 schematically illustrates, in top view, an elementary cell of a DRAM plane at an intermediary stage of its forming.
Figure 2A:
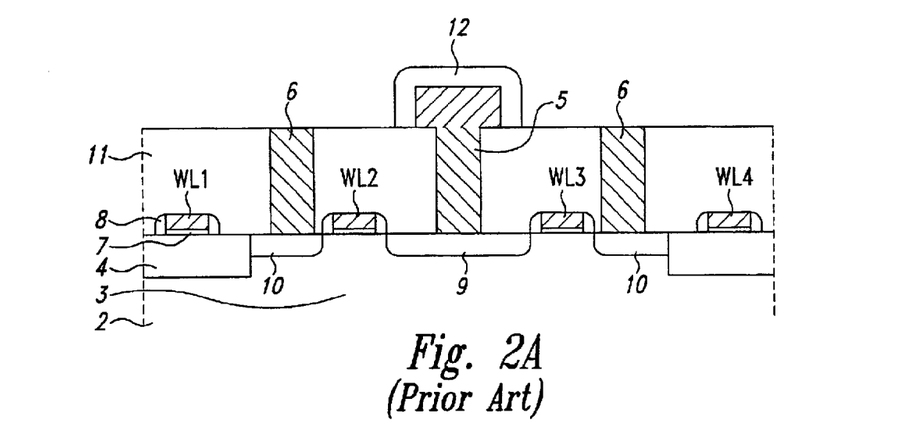
FIGS. 2A, 2B, and 2C show, in partial and simplified cross-section views, the elementary cell of FIG. 1 formed according to state-of-the-art methods.
Figure 2B:
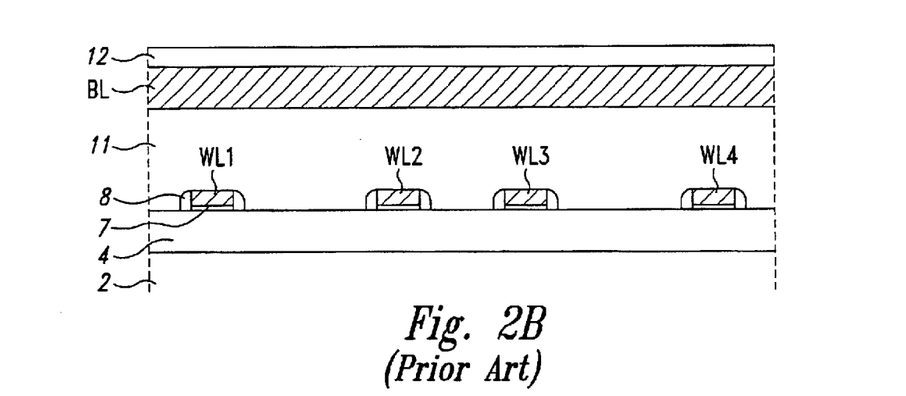
Figure 2C:
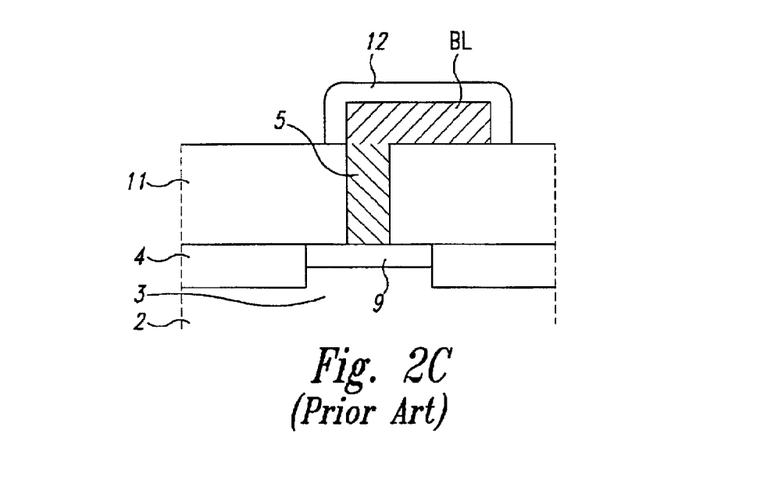

FIG. 1 partially and schematically illustrates in a top view, and FIGS. 2A, 2B, 2C in a cross-section view along respective axes A—A, B—B, and C—C, the structure of an elementary cell 1 of a DRAM of folded bit line type under manufacturing in a semiconductor substrate 2, typically single-crystal silicon. A memory includes a plurality of such identical elementary cells 1 arranged in rows and columns. Each elementary cell 1 is formed in an active region 3, generally rectangular, delimited in substrate 2 by insulating trenches 4. Insulating trenches 4 are obtained by digging into substrate 2, then filling the formed hollowings with an insulating material, generally silicon oxide ($SiO_2$). In FIG. 1, the limit between active region 3 and insulating trenches 4 is illustrated by stripe-dot lines.

Four conductive lines WL1, WL2, WL3, and WL4 cross the cell. Each of these lines, which are the word lines of the general memory device, is insulated from the underlying active areas 3 by an insulating layer 7, typically silicon oxide. Their lateral walls are conventionally provided with spacers 8. Two "active" word lines WL2 and WL3 cross the cell in its active region 3. Active word lines WL2 and WL3 are common to all cells of a same row. The other two word lines WL1 and WL4 run over either side of active region 3, that is, over insulating trenches 4. Each of word lines WL1 and WL4 is one of the two active word lines of two different elementary cell rows, these two rows (not shown) being distinct from that containing elementary cell 1.

After formation of word lines WL1, WL2, WL3, and WL4, heavily-doped regions 9 and 10 of a conductivity type opposite to that of substrate 2 have been formed by implantation/diffusion at the surface of active region 3.

Active word lines WL2, WL3 then form the gates of two MOS transistors of the same type, having common drain/source regions 9 and distinct source/drain regions 10, each formed in the active region 3 between spacer 8 of the corresponding word line and the neighboring insulating trench 4.

Substrate 2 (active region 3 and trenches 4) and lines WL1, WL2, WL3, and WL4 are altogether covered with a thick insulating layer 11, typically silicon oxide. The upper surface of layer 11 is substantially planar. Layer 11 has been locally opened to at least partially expose the three semiconductor regions 9 and 10. Contacts 5 and 6, respectively with drain/source region 9 and each of source/drain regions 10, result from the filling of the openings thus formed by means of a conductive material, typically metal, generally tungsten.

A bit line BL, common to the cells of a same column, runs over layer 11 above an insulating trench 4 separating two distinct cell columns. Bit line BL is encapsulated by an insulating structure 12. Bit line BL is designed to contact drain/source region 9 via contact 5.

Bit line BL may be formed before or after two memory points (capacitors) not shown, also formed on layer 11, but each in contact with one of the two source/drain regions 10 via a contact 6.

Be they formed after or before bit lines BL, the memory point structures must then take into account the presence or the subsequent forming thereof on a same level (the upper surface of layer 11). This leads to managing manufacturing constraints, in particular alignment constraints, which complicate processes.

More specifically, protecting the structure against possible capacitive couplings or short-circuits, caused by misalignments of masks of formation of bit lines or memory points, limits the density of the obtained memory device.

Further, since the planar surface area available on layer 11 is limited, obtaining memory devices with capacitors having a sufficient capacitance imposes using memory points with a complex structure and/or limiting the device density.

SUMMARY OF THE INVENTION

An embodiment of the present invention provides a novel manufacturing method of a DRAM device, which reduces the preceding constraints.

The method is compatible with the forming of the DRAM on a same substrate as a logic circuit external to the memory.

The method includes two active word lines having a common drain/source region and having distinct source/drain regions contacting two memory points, including, after the forming of insulated conductive lines, the steps of:

a) depositing a first insulating layer;

b) depositing a second insulating layer, selectively etchable with respect to the first insulating layer;

c) etching the second insulating layer to only maintain it above the insulated conductive lines, at least inside and around an active region;

d) depositing and leveling a third thick insulating layer selectively etchable with respect to at least the second insulating layer;

e) opening the first and third insulating layers to at least partially expose the common drain/source region and an insulating trench;

f) depositing a conductive material to fill the previously-formed opening;

g) performing a chem-mech polishing of the entire structure; and h) depositing a fourth insulating layer, selectively etchable with respect to the third insulating layer.

According to an embodiment of the present invention, step e) consisting of opening the first and third insulating layers to at least partially expose the common drain/source region and an insulating trench is implemented to open the first and third insulating layers to at least also partially expose the source/drain regions, the conductive material deposited at step f) being deposited to fill all the openings thus formed.

According to an embodiment of the present invention, step e) consisting of opening the first and third insulating layers to at least partially expose the common drain/source region and an insulating trench is preceded by the steps of:

i) opening the first and third insulating layers to at least partially expose the source/drain regions;

j) depositing a conductive material in the openings thus formed; and k) performing a chem-mech polishing of the entire structure, whereby contacts are formed with the source/drain regions.

According to an embodiment of the present invention, step k) of chem-mech polishing is followed by the deposition of an additional insulating layer on the entire structure, step e) then consisting of successively opening the additional insulating layer and the first and third insulating layers to at least partially expose the common drain/source region and an insulating trench.

According to an embodiment of the present invention, step g) of chem-mech polishing of the entire structure, or step h) of deposition of the fourth insulating layer, selectively etchable with respect to the third insulating layer, is followed by the steps of:

l) opening the first and third insulating layers to at least partially expose the source/drain regions;

m) depositing a conductive material in the openings thus formed; and n) performing a chem-mech polishing of the entire structure, whereby contacts are formed with the source/drain regions.

According to an embodiment of the present invention, step a) of deposition of the first insulating layer is preceded by the deposition of an additional insulating layer selectively etchable with respect to the filling material of underlying insulating trenches and with respect to the first insulating layer.

According to an embodiment of the present invention, the first and third insulating layers are made of silicon oxide ($SiO_2$) and the second and fourth insulating layers as well as the additional insulating layer are made of silicon nitride ($Si_3N_4$).

According to an embodiment of the present invention, the memory cell is formed in a same substrate as logic circuits.

The present invention also provides a DRAM cell structure including two inactive word lines formed on insulating trenches, on either side of an active region of a substrate, and two active word lines having a common drain/source region and having distinct source/drain regions contacting two memory points, the four word lines, the insulating trenches, and the substrate being covered at least partially with a multiple-layer of at least three insulating layers, formed of first and third layers deposited over the entire structure, and of a second layer removed from the active region, except above the word lines, and being made of a material selectively etchable with respect to the first and third layers, and a bit line of the cell directly resting upon at least a portion of its drain/source region as well as on a neighboring insulating trench, the bit line and the third insulating layer being covered with a fourth insulating layer selectively etchable with respect to the third layer.

According to an embodiment of the present invention, the multiple-layer rests upon an additional insulating layer selectively etchable with respect to the first superposed insulating layer and with respect to the filling material of the underlying insulating trenches.

The foregoing objects, features and advantages of the present invention will be discussed in detail in the following non-limiting description of specific embodiments in connection with the accompanying drawings.

DETAILED DESCRIPTION OF THE INVENTION

For clarity, the same elements have been referred to with the same references in the different drawings and, further, as usual in the representation of integrated circuits, the different cross-section views are not drawn to scale.

An embodiment of the present invention will be illustrated hereafter in relation with FIGS. 3A to 3D applied to the forming in a same substrate of CMOS-type logic circuits and of an elementary cell of a DRAM device of folded bit line type. More specifically, the logic side has been shown to the left of FIGS. 3A to 3D and the memory side has been shown to the right.

It is desired to form an elementary cell having a structure in top view identical to that illustrated in FIG. 1. FIGS. 3A to 3D show, on the right-hand side, elementary cell 1 of FIG. 1 in cross-section along its main orientation axis, that is, line A—A of FIG. 1.

Figure 3A:
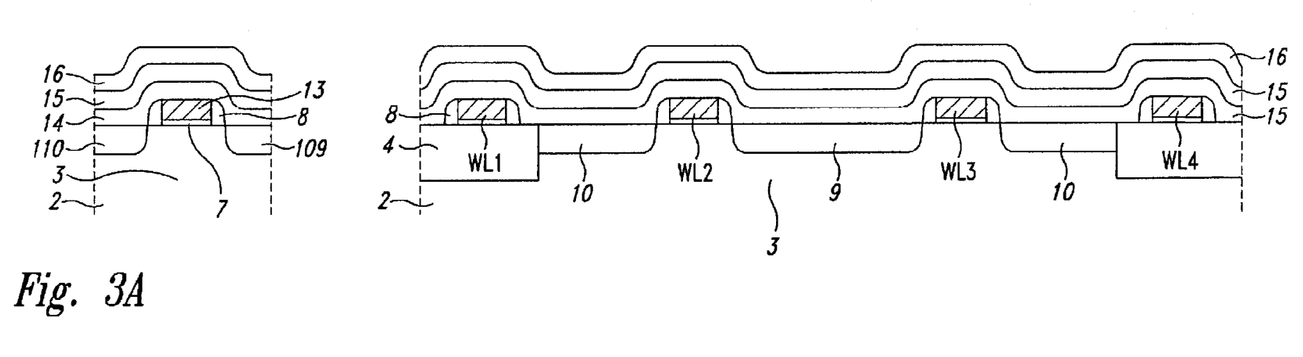
FIGS. 3A, 3B, 3C, and 3D show, in partial and simplified cross-section views, an elementary cell at different steps of its manufacturing according to the present invention.

FIG. 3A illustrates the result of initial steps of a method according to the present invention. On the logic side and on the memory side, active areas 3 have first been defined in a single-crystal silicon substrate 2, for example, by forming insulating trenches 4 filled with an insulating material, for example, silicon oxide. Then, a thin dielectric layer 7 and a conductive layer 13 have been successively formed and etched to define, on the memory and logic sides, insulated conductive structures. More specifically, on the memory side, these structures cross the entire memory plane to form word lines of the memory array. Elementary cell 1 is crossed in its active portion by two word lines WL2 and WL3, and surrounded by two word lines WL1 and WL4 running above insulating trenches 4.

On the memory and logic side, the lateral walls of the different insulated conductive structures thus formed are covered with insulating spacers 8.

An implantation/diffusion of a dopant of a conductivity type opposite to that of substrate 2 has then been performed to form, on the logic side and on the memory side, in active areas 3, MOS transistor sources and drains.

On the memory side, active word lines WL2 and WL3 form the gates of two such transistors and define, in underlying active area 3, a channel region separating drain/source regions 9 and source/drain regions 10. More specifically, source/drain regions 10 of the two resulting MOS transistors are distinct and formed between the gate structures and insulating trenches 4. However, their drain/source region 9 is common, and formed between lines WL2 and WL3.

On the logic side, the insulated conductive structure 7 also forms the gates of MOS transistors and define a channel region separating drain/source and source/drain regions 109 and 110.

Three insulating layers 14, 15, and 16 are then successively deposited. The first insulating layer 14 is made of a material selectively etchable with respect to substrate 2 and to the material filling underlying insulating trenches 4. Layer 15 is made of an insulating material selectively etchable with respect to underlying layer 14. Finally, layer 16 is made of an insulating material selectively etchable with respect to underlying insulating layer 15. The nature of layer 16 will be specified hereafter, in relation with FIG. 3B.

Figure 3B:
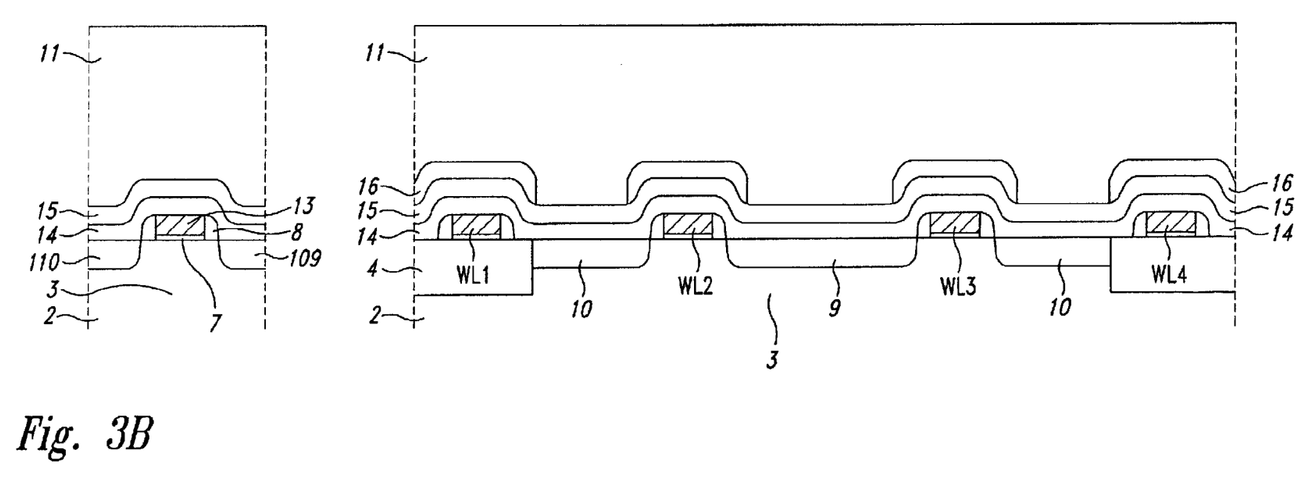

At the next steps, illustrated in FIG. 3B, insulating layer 16 is removed on the logic side. On the memory side, insulating layer 16 is etched to be maintained and to extend slightly beyond word lines WL1, WL2, WL3, and WL4. This etching is followed by the deposition of a thick insulating layer 11. Layer 11 is made of a material selectively etchable with respect to the insulating material of the remaining portions of layer 16. In accordance with standard CMOS methods implemented on the logic side, it is preferable for thick insulating layer 11 to be made of silicon oxide. Insulating layer 16 will then be made of an insulating material other than silicon oxide. It may however be of same nature as layer 14, for example, silicon nitride ($Si_3N_4$). Layer 15 may however be of same nature as layer 1.

Figure 3C:
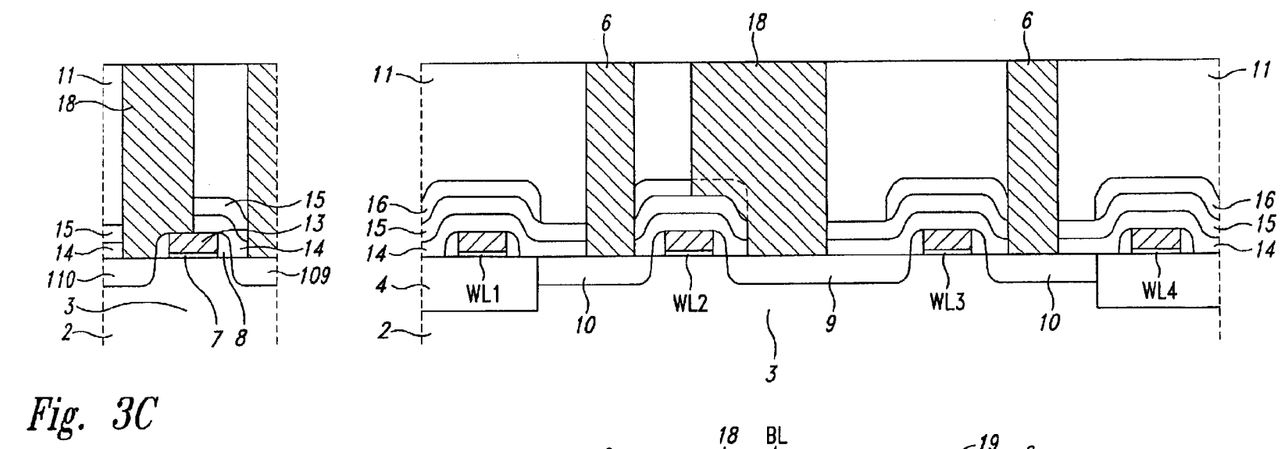

At the next steps, illustrated in FIG. 3C, openings are formed in layer 11. On the logic, side, these openings are formed to expose either semiconductive regions of substrate 2, for example, source/drain regions 110 and/or drain/source regions 109 of the logic transistors, or conductive lines 13 forming the gate electrode of the logic transistors, or to simultaneously expose some of these regions. On the memory side, the common drain/source region 9 is at least partially exposed between active word lines WL2, WL3.

For this purpose, as illustrated in FIG. 3C, layers 11, 15, and 14 are successively etched on the memory side and on the logic side. Assuming that layers 11 and 15 are of same nature, they are etched simultaneously. In case of a misalignment of the mask upon etching of insulating layers 11 and 15, on the memory side, the portions of layer 16 above the word lines remain intact, as illustrated above line WL2. Indeed, layers 11 and 15 on the one hand and layer 16 on the other hand, are made of materials selectively etchable with respect to each other.

According to an embodiment, on the memory side, layers 11, 15, and 14 are first opened to expose source/drain regions 10. The openings thus formed are then filled with a conductive material to form contacts 6. The conductive structures of neighboring word lines WL1, WL2, WL3, and WL4 are then protected, as will be further detailed hereafter, against a possible misalignment of the opening mask of layer 11 by the remaining portions of insulating layer 16.

Then, on the memory side and on the logic side, layers 11 and 15 are etched above drain/source regions 9, and the insulating layer of different nature 14 is etched. At this stage of the process, on the memory side, the possibly exposed portions of layer 16 may be etched if layer 16 is of the same nature as layer 14, but the etching will then stop at the level of layer 15, which is of a different nature.

A conductive material 18 is then deposited and etched. Preferably, conductive material 18 is a metal, for example, tungsten. Material 18 is then etched to be removed from the upper horizontal planar surfaces of thick insulating layer 11. This removal may advantageously be performed by a chem-mech polishing method (CMP).

Figure 4:
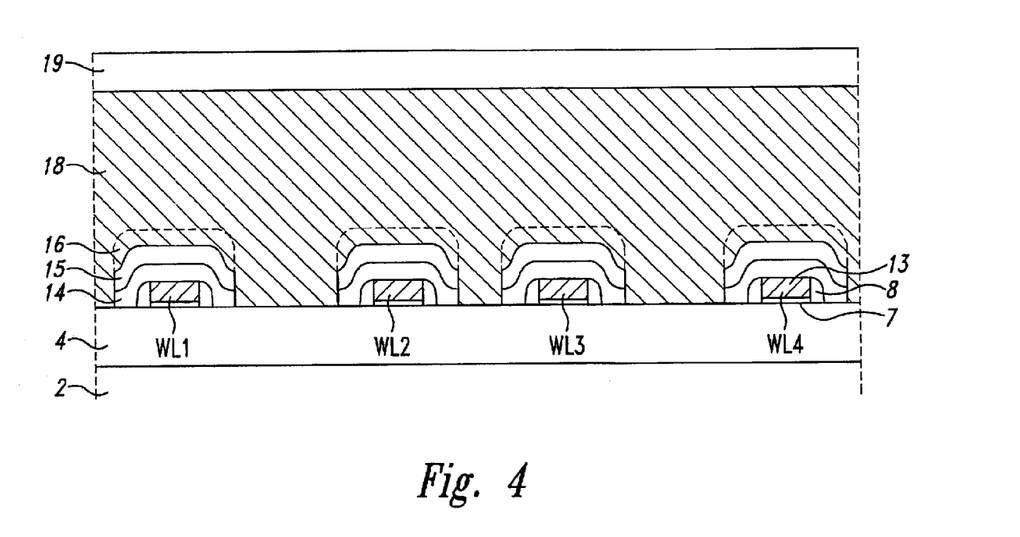
FIG. 4 shows, in a cross-section view along axis B—B, the elementary cell of FIG. 1 formed according to the present invention.
Figure 5:
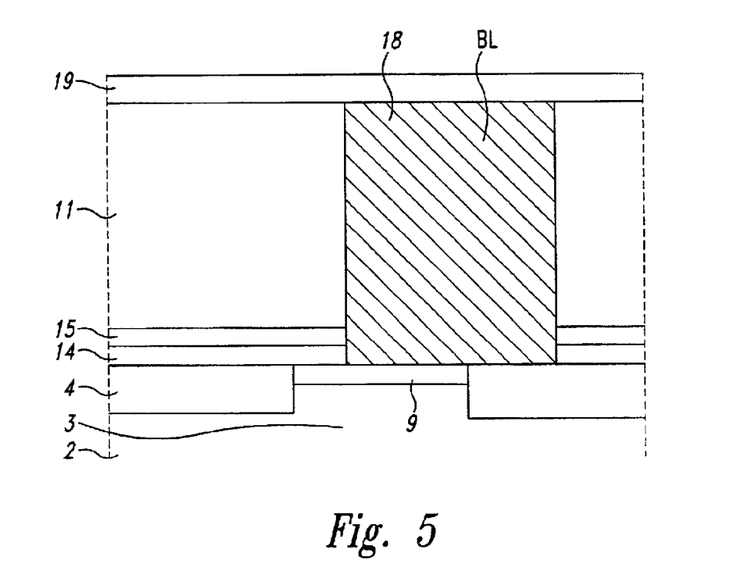
FIG. 5 shows, in a cross-section view along axis C—C, the elementary cell of FIG. 1 formed according to the present invention.

On the memory side, the etching of insulating layers 11, 16, 15, and 14 has been performed so that the opening thus formed extends, as better illustrated in FIG. 5, above active region 3 and an insulating trench 4 separating two cell columns. This extension is formed in a perpendicular plane to be continuous in the entire memory plane, as better illustrated in FIG. 4, which shows a cross sectional view along axis B—B of FIG. 1. Thus, upon deposition of conductive material 18, a bit line BL is formed in this extension. Bit line BL is then directly put in contact with region 9, between two memory cell columns.

On the logic side, it should be noted that material 18 enables transferring to an upper level a contact with an underlying semiconductor region 109, and/or putting in electric contact different portions of the logic circuit, such as, for example, source/drain region 110 and gate 13 of a logic transistor.

Figure 3D:
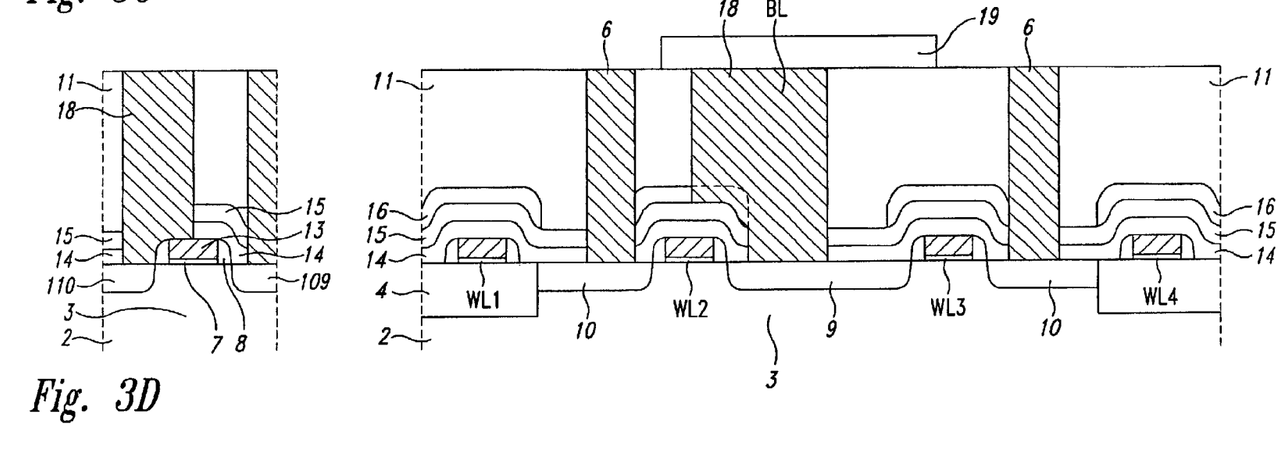

At the next steps, illustrated in FIG. 3D, an insulating layer 19 is deposited on the planar surface of layer 11 and of the openings filled with material 18. Insulating layer 19 is made of a material selectively etchable with respect to underlying insulating layer 11 and with respect to conductive material 18. It should be noted that layer 19 is deposited to maintain the planarity of the structure.

Layer 19 is etched to be suppressed on the memory side above contacts 6 formed with source/drain semiconductor regions 10. On the logic side, layer 19 may be completely removed, as illustrated, or only removed at the locations where contacts must subsequently be formed. It may also be maintained in place to be used as an etch stop and/or protective coating layer in case of a misalignment of a mask in a subsequent etching.

Then, the process carries on to form memory points (capacitors) in contact with underlying semiconductor regions 10 via contacts 6.

At this stage of the process, the problems linked to the subsequent/previous forming of bit lines above thick insulating layer 11 are advantageously avoided. This enables increasing the density of the formed memory device, while being compatible with standard CMOS process sequences. Further, since the surface of layer 19 on which the memory points (capacitors) are formed is planar, and not deformed by protruding bit line structures, the memory point forming will be simplified.

FIGS. 4 and 5 illustrate, in respective cross-section views along lines B—B and C—C of FIG. 1, the state of elementary cell 1 of FIG. 1, formed according to the present invention. More specifically, elementary cell 1 is shown at the manufacturing step of FIG. 3D.

FIG. 4 illustrates a portion of substrate 2 having its surface entirely formed of an insulating trench 4 separating two memory cell columns. The four word lines WL1, WL2, WL3, and WL4 run over trench 4. The word lines are covered with insulating layers 14, 15 and 16. All of this is covered with conductive material 18 and insulating layer 19. The resulting bit line BL thus crosses the different word lines WL1, WL2, WL3, and WL4 without reaching them. Further, bit line BL is protected from the memory point structures subsequently formed by superposed insulating layer 19.

FIG. 5 illustrates the width of cell 1. Active region 3, the surface of which is formed of the sole drain/source region 9 common to the two active word lines of cell 1, is defined in substrate 2 by insulating trenches 4. A multiple-layer of insulating layers 14, 15, 16, and 11 is cut by a conductive column 18 at least partially in contact with region 9 and extending laterally above an insulating trench 4. Conductive column 18 forms bit line BL interconnecting drain/source regions 9 of all the cells in a same column.

According to a specific embodiment of the present invention, the nature and thickness of the different layers are the following:

gate insulator 7: silicon oxide, from 1 to 10 nm, for example, 3 nm;

gate conductor 13: polysilicon;

spacers 8: silicon nitride;

insulating layer 14: silicon nitride, from 10 to 300 nm, for example, 80 nm;

insulating layer 15: silicon oxide, from 10 to 300 nm, for example, 80 nm;

insulating layer 16: silicon nitride, from 10 to 300 nm, for example, 80 nm;

insulating layer 11: silicon oxide, from 100 to 800 nm, for example, 500 nm; and insulating layer 19: silicon nitride, from 10 to 300 nm, for example 80 nm.

Further, the materials of bit line BL and of contacts 6 may be of same nature, preferably metal, for example, tungsten. However, it will be possible to use conductor or semiconductor materials, and/or to use different materials.

In the case where bit lines BL and contacts 6 are made of a same material, they may be formed simultaneously, instead of being formed successively as previously discussed in relation with FIG. 3C.

In the case where bit lines BL and contacts 6 are made of different conductive materials, if these materials are selectively etchable with respect to each other, contacts 5 may be formed, as discussed previously in relation with FIG. 3C, before bit lines BL. However, contacts 6 may also be formed after the forming of bit lines BL. If the materials forming bit lines BL and contacts 6 are selectively etchable with respect to each other, contacts 6 may then indifferently be formed before or after deposition and etching of layer 19.

If the materials forming bit lines BL and contacts 6 are different from each other, contacts 6 may further be formed before or after bit lines BL. However, if they are formed before the bit lines, the additional deposition of a protective insulating layer will be provided. This layer will then preferably be of same nature as underlying thick insulating layer 11. It will be, considering the previously-detailed example of embodiment, a silicon oxide layer having a thickness ranging between 10 and 300 nm, for example 80 nm. However, if contacts 6 are formed after bit lines BL, they will preferably be formed after the deposition and etching of layer 19, to protect bit lines BL upon etching of the material forming contacts 6.

Of course, the present invention is likely to have various alterations, modifications, and improvements which will readily occur to those skilled in the art. In particular, it applies to any process of simultaneous manufacturing of MOS transistors and of DRAM cells incorporating steps of a standard CMOS process. Thus, the nature and thickness of each of the layers may be modified according to the constraints linked to the standard CMOS processes in which the steps specific to the memory cell forming are incorporated. Thus, the insulators used to form layers 14, 15, and 16 may be chosen from among the various known materials or combinations thereof, for example, in the form of multiple-layers. It will however be ascertained in this latter case to respect the previously-discussed constraints of protection of the word lines against misalignments upon opening of contacts towards underlying semiconductor regions.

Further, although the use of a first insulating layer 14 selectively etchable with respect to the insulating material of trenches 4 and of upper layer 15 is preferred, it is possible to only use the combination of layers 15 and 16 to ensure the protection of the word lines against the bit lines. The function of layer 14 only is to avoid an overetching of insulating trench 4 when said trench is formed of an insulating material of same nature as upper insulating layer 15.

Moreover, the deposition of any metal conductive layer may be preceded by the deposition of a bonding and/or etch stop layer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a DRAM cell including two active word lines having a common drain/source region and having distinct source/drain regions contacting two memory points, comprising, after the forming of insulated conductive lines on a semiconductor substrate, the steps of:

a) depositing a first insulating layer;

b) depositing a second insulating layer, selectively etchable with respect to the first insulating layer;

c) etching the second insulating layer to only maintain it above the insulated conductive lines, at least above an active region of the substrate;

d) depositing and leveling a third thick insulating layer selectively etchable with respect to the second insulating layer;

e) forming an opening in the first and third insulating layers to at least partially expose the common drain/source region and an insulating trench;

f) depositing a conductive material to fill the previously-formed opening;

g) performing a chem-mech polishing; and h) depositing a fourth insulating layer, selectively etchable with respect to the third insulating layer.

2. The method of claim 1, wherein step e) consisting of forming the opening the first and third insulating layers to at least partially expose the common drain/source region and an insulating trench is implemented to open the first and third insulating layers to at least also partially expose the source/drain regions, and wherein the conductive material deposited at step f) is deposited to fill all the openings thus formed.

3. The method of claim 1, wherein step e) consisting of opening the first and third insulating layers to at least partially expose the common drain/source regions and an insulating trench is preceded by the steps of:

i) opening the first and third insulating layers to at least partially expose the source/drain regions;

j) depositing a conductive material in the openings thus formed; and k) performing a chem-mech polishing, whereby contacts are formed with the source/drain regions.

4. The method of claim 3, wherein step k) of chem-mech polishing is followed by the deposition of an additional insulating layer, step e) then consisting of successively opening the additional insulating layer and the first and third insulating layers to at least partially expose the common drain/source region and an insulating trench.

5. The method of claim 1, wherein step g) of chem-mech polishing, or step h) of deposition of the fourth insulating layer, selectively etchable with respect to the third insulating layer, is followed by the steps of:

l) forming openings in said first and third insulating layers to at least partially expose the source/drain regions;

m) depositing a conductive material in the openings thus formed; and n) performing a chem-mech polishing, whereby contacts are formed with the source/drain regions.

6. The method of claim 1, wherein step a) of deposition of the first insulating layer is preceded by the deposition of an additional insulating layer selectively etchable with respect to a filling material of underlying insulating trenches and with respect to the first insulating layer.

7. The method of claim 6, wherein the first and third insulating layers are made of silicon oxide and wherein the second and fourth insulating layers as well as the additional insulating layer are made of silicon nitride.

8. The method of claim 1, wherein the memory cell is formed in a same substrate as logic circuits.

9. The method of claim 1 wherein step d) depositing and leveling the third insulating layer is performed after step c) etching the second insulating layer.

10. The method of claim 9 wherein the third insulating layer contacts the first insulating layer through an opening formed in the second insulating layer above the active region during the etching step c).

11. The method of claim 1 wherein step e) forming an opening comprises forming a channel in at least the third insulating layer above the insulating trench, and wherein step f) depositing the conductive material comprises filling the trench with conductive material to form a bit line.

12. A method for manufacturing a DRAM cell, comprising:
    forming an insulating trench in a semiconductor substrate to define a boundary of an active region of the substrate;
    forming a wordline across the active region and insulated therefrom;
    depositing a first insulating layer over the substrate and wordline;
    depositing a second insulating layer, selectively etchable with respect to the first insulating layer, over the first insulating layer;
    etching a first opening in the second insulating layer above a portion of the active region of the substrate without exposing any portion of the first insulating layer directly above the wordline;
    depositing, after the etching step, a third insulating layer, selectively etchable with respect to the second insulating layer, over the first and second insulating layers and in the first opening;
    etching a second opening in the first and third insulating layers at the first opening; and
    depositing a conductive material within the second opening.

13. The method of claim 12 wherein the etching the second opening step comprises etching a channel in at least the third insulating layer over the insulating trench, and wherein the depositing the conductive material step includes depositing conductive material in the channel.

14. The method of claim 12, further comprising planarizing an upper surface of the third insulating layer.

15. The method of claim 14, wherein the planarizing step is performed after the depositing conductive material step, and wherein the planarizing step comprises removing conductive material from above the upper surface of the third insulating layer.

16. The method of claim 12 wherein the etching a second opening step comprises exposing a common drain/source region of the DRAM cell.

17. The method of claim 12, further comprising etching a third opening in the first and third insulating layers at the first opening, and depositing a conductive material within the third opening.

18. The method of claim 17 wherein the etching a third opening step is performed after the planarizing step.

19. The method of claim 12, further comprising depositing a fourth insulating layer over the third insulating layer.

20. The method of claim 12, further comprising depositing a fourth insulating layer prior to depositing the first insulating layer.

* * * * *